United States Patent
Kobata

(10) Patent No.: US 8,891,302 B2
(45) Date of Patent: Nov. 18, 2014

(54) ELECTRONIC EQUIPMENT

(71) Applicant: Nihon Dempa Kogyo Co., Ltd., Tokyo (JP)

(72) Inventor: Tsukasa Kobata, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 24 days.

(21) Appl. No.: 13/925,841

(22) Filed: Jun. 25, 2013

(65) Prior Publication Data

US 2014/0003166 A1 Jan. 2, 2014

(30) Foreign Application Priority Data

Jun. 27, 2012 (JP) ................. 2012-144199

(51) Int. Cl.
*G11C 16/22* (2006.01)
*G11C 7/00* (2006.01)

(52) U.S. Cl.
CPC ....................... *G11C 7/00* (2013.01)
USPC ...... 365/185.04; 327/105; 711/164; 713/183; 713/193

(58) Field of Classification Search
USPC .............. 365/185.04; 327/105; 711/163, 164; 713/182, 183, 189–193
See application file for complete search history.

(56) References Cited

U.S. PATENT DOCUMENTS

| | | | | |
|---|---|---|---|---|
| 7,907,447 B2 * | 3/2011 | Tao et al. | ................. | 365/185.11 |
| 8,102,710 B2 * | 1/2012 | Pekny et al. | ............. | 365/185.08 |
| 8,103,844 B2 * | 1/2012 | Beaver | .......................... | 711/163 |
| 8,117,378 B2 * | 2/2012 | Mietus et al. | ................. | 711/103 |
| 8,826,023 B1 * | 9/2014 | Harmer | ........................ | 713/176 |

FOREIGN PATENT DOCUMENTS

JP 2008-541591 11/2008

* cited by examiner

*Primary Examiner* — Harry W Byrne
*Assistant Examiner* — Lance Reidlinger
(74) *Attorney, Agent, or Firm* — Jianq Chyun IP Office

(57) ABSTRACT

Electronic equipment according to the present disclosure includes a writable non-volatile memory, a plurality of volatile memories, and a sequencer. The writable non-volatile memory stores an operation parameter group required to operate the electronic equipment. Respective addresses are assigned to the plurality of volatile memories. The plurality of volatile memories includes a specified volatile memory. The specified volatile memory stores a part of the operation parameters among the operation parameter group. The specified volatile memory is accessible by inputting an Enable signal. The sequencer can read and write the non-volatile memory when the Enable signal allows an operation parameter stored in the volatile memory to be written to the non-volatile memory.

9 Claims, 4 Drawing Sheets

ELECTRONIC EQUIPMENT

CROSS-REFERENCE TO RELATED APPLICATION

This application claims the priority benefit of Japanese application serial no. 2012-144199, filed Jun. 27, 2012. The entirety of the above-mentioned patent application is hereby incorporated by reference herein and made a part of specification.

BACKGROUND

1. Technical Field

The present disclosure relates to electronic equipment where, for example, an operation parameter for operating a main body of the electronic equipment is set.

2. Description of the Related Art

One of the types of electronic equipment includes a frequency synthesizer using a digital process. This frequency synthesizer includes a circuit portion and a microcontroller. The circuit portion includes an analog circuit and a digital processing portion. The analog circuit includes a voltage-controlled oscillator. The digital processing portion performs a digital process in a part of a PLL loop. The microcontroller serves as a controller that controls the circuit portion. Examples of operation parameters for the frequency synthesizer include a computing parameter required for a digital process, a nominal frequency, a variable width of frequency, and similar parameter.

To set the operation parameter, the operation parameter is written to a non-volatile memory in the frequency synthesizer by the manufacturer. When the frequency synthesizer is powered on, the operation parameter in the non-volatile memory is read out to a register in the frequency synthesizer, and then the frequency synthesizer is operation-able state.

Meanwhile, if the user makes an unnecessary change to the operation parameter, which is not intended by the manufacturer, satisfactory operations may not be achieved. On the other hand, some operation parameters are required to be freely set by the user.

Japanese Unexamined Patent Application No. 2008-541591 discloses a technique where data is encrypted by a secure processor so that a third party cannot decipher the encrypted data. However, the method differs from that of the present disclosure.

[Patent Literature 1] Japanese Unexamined Patent Application No. 2008-541591

SUMMARY

The present disclosure has been made to solve the above-described problems, and the present disclosure is to provide electronic equipment that prevents unnecessary rewriting of an operation parameter for the electronic equipment while a part of parameters can be rewritten by the user.

An electronic equipment according to the present disclosure includes: a writable non-volatile memory for storing an operation parameter group to operate the electronic equipment; an input unit to which a setting signal to set the operation parameter is to be inputted; a plurality of first volatile memories for storing respective plurality of the operation parameters with a different address from one another; a plurality of second volatile memories for storing respective plurality of the operation parameters with a different address from one another, respective plurality of the operation parameters in the second volatile memories being different from respective plurality of the operation parameters in the first volatile memories; a first enable output unit for outputting an Enable signal which enables the input unit to write the operation parameter to the second volatile memory by inputting a first secret code from the input unit; a sequencer for reading and writing the non-volatile memory; a second enable output unit for outputting an Read Enable signal to the sequencer by inputting a Read command and a second secret code from the input unit, the Enable signal allowing an operation parameter stored in the non-volatile memory to be read out to at least the second volatile memory; and a third enable output unit for outputting an Write Enable signal to the sequencer by inputting a Write command and a third secret code from the input unit, the Enable signal allowing an operation parameter stored in at least the second volatile memory to be written to the non-volatile memory.

The present disclosure premises to include a non-volatile memory and a plurality of volatile memories to store an operation parameter of the electronic equipment. The non-volatile memory is read/written by a sequencer. Respective addresses are assigned to the plurality of volatile memories. The pluralities of operation parameters read out from the non-volatile memory are stored in the corresponding volatile memories with addresses different from one another. Further, a part of the volatile memories are configured to be accessible by inputting a secret code from an external computer. The non-volatile memory can be read or written via the sequencer by inputting Read/Write commands and a secret code (may be the same as or different from the secret code) from the computer. Consequently, unnecessary rewriting of a part of the operation parameters among the operation parameter group and the data stored in the non-volatile memory due to access can be prevented.

Additionally, a secret code is to be inputted to the volatile memory. Only a person who knows both the address of the volatile memory and the secret code is allowed to access the specified volatile memory and the non-volatile memory, thus further reliably preventing unnecessary rewriting due to access.

DETAILED DESCRIPTION

Figure 1:
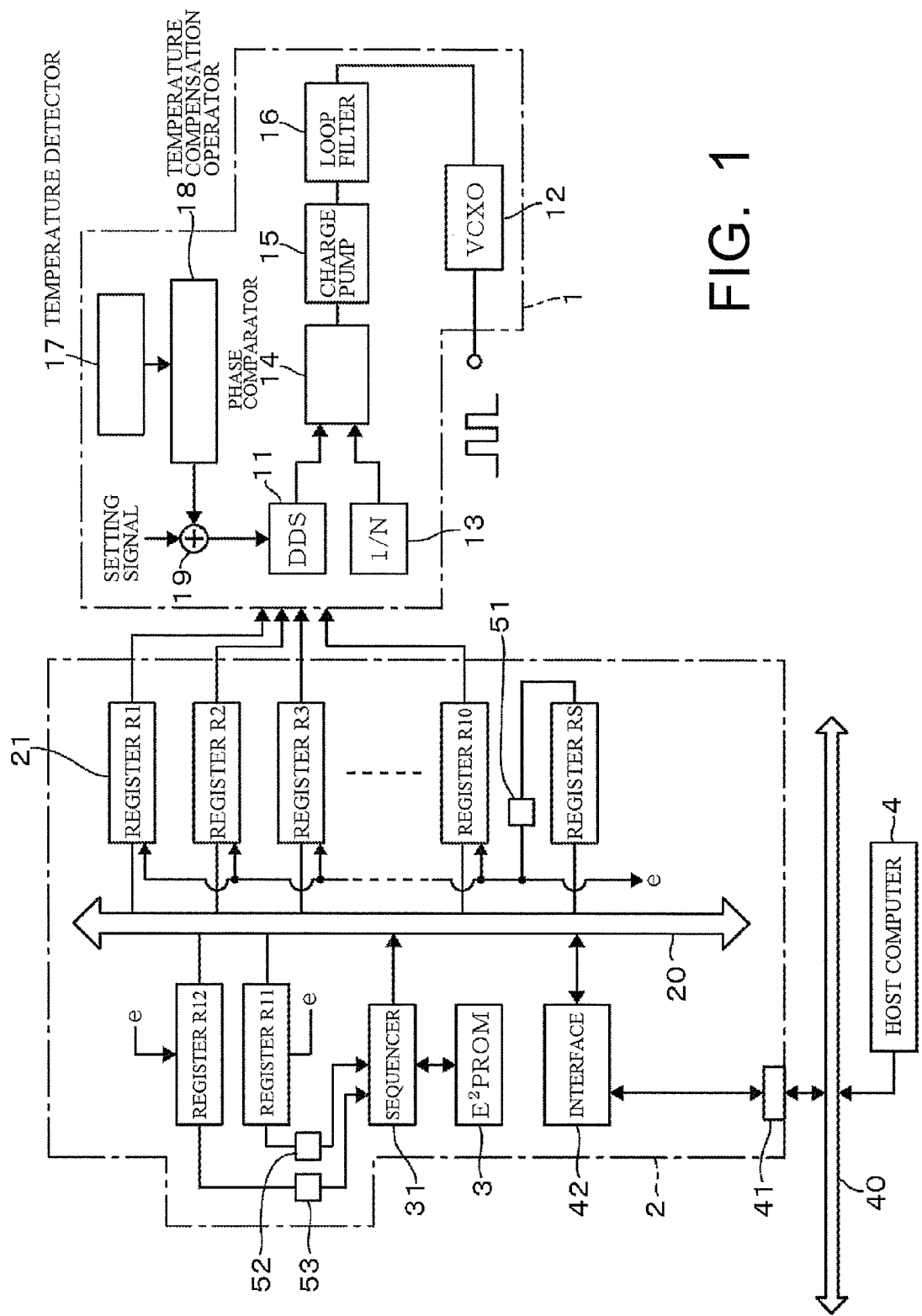
FIG. 1 is a block diagram illustrating an overall configuration according to an embodiment of the present disclosure.

The following describes an embodiment where electronic equipment according to the present disclosure is applied to a frequency synthesizer, which is an oscillator. FIG. 1 is a block diagram illustrating an overall configuration of the frequency synthesizer. The frequency synthesizer includes an oscillator circuit unit 1 (the main body of frequency synthesizer) and a controller 2 with a microcontroller. The controller 2 has a function that outputs a parameter needed for operating the oscillator circuit unit 1 and a function that controls the oscillator circuit unit 1.

The oscillator circuit unit 1 includes a Direct Digital Synthesizer (DDS) 11 that has a function outputting a frequency signal corresponding to frequency data in response to an input of frequency data (a digital value) that is a setting signal of a frequency. A typical DDS 11 has a function, for example, that generates a sawtooth wave corresponding to the frequency data using a digital value. This function outputs a square wave at every timing point (zero crossing point) where a negative digital value becomes a positive digital value in a series of digital values forming the sawtooth wave.

Frequency signals, which are output from the DDS 11 and form a square wave, are reference clocks. On the other hand, an output of a voltage-controlled oscillator 12, which forms a part of the oscillator circuit unit 1, is divided by a divider 13. The phase of pulses output from the divider 13 is compared with the phase of the reference clock by a phase comparator 14. A phase difference obtained from the comparison result by the phase comparator 14 is converted into an analog signal by a charge pump 15. The converted analog signal is input to a loop filter 16 and is then integrated. Next, an output from the loop filter 16 is input to the voltage-controlled oscillator 12 as a control voltage, thus ensuring stable control of a Phase Locked Loop (PLL).

In FIG. 1, reference numeral 17 denotes a temperature detector, and reference numeral 18 denotes a temperature compensation operator. The temperature compensation operator 18 operates a compensation amount that compensates a frequency setting signal based on a temperature value detected by a temperature detector 17. The frequency setting signal is added to the compensation amount and becomes a setting signal of the DDS 11. Since the frequency of the operation clock of the DDS 11 is affected by a temperature, the compensation amount is employed to offset (compensate) this effect.

The controller 2 includes registers 21, which are a plurality of volatile memories. The role of the group of registers 21 is to hold an operation parameter required to operate the oscillator circuit unit 1. Some registers 21 in the group have another role, which will be described below. The number of operation parameters may be equal to or more than 1000, for example. However, FIG. 1 illustrates the case where the number of operation parameters is ten for convenience, and the operation parameters are stored into registers R1 to R10, respectively. The registers are assigned as reference numeral 21 or individual reference numerals R1 to R12 and RS depending on the description. These registers R1 to R12 and RS are assigned with different addresses, respectively, and are connected to a bus 20.

For example, the registers R1 and R2 are configured so that the user can freely rewrite data (the operation parameter). Registers R1 and R2 correspond to first volatile memories. Registers R3 to R10, which correspond to second volatile memories, are devised to prevent the user from rewriting the operation parameter. It is required that the former operation parameters be freely rewritable by the user. The former operation parameters correspond to, for example, a variable width of frequency and setting of an ON/OFF state of an alarm. For the latter operation parameters, rewriting is not desired by the manufacturer. The latter operation parameters include operation parameters that possibly cause a problem in performance of the frequency synthesizer if rewritten. Specifically, the latter operation parameters include various coefficients for digital operation, a nominal frequency, a gain (a ratio between a frequency setting signal input to an adder 19 and a setting value output from the register 21), and similar parameter. Registers R11, R12, and RS will be described below.

Reference numeral 3 denotes a rewritable non-volatile memory, $E^2PROM$. The $E^2PROM$ is externally mounted to a microcontroller, which constitutes the controller 2. Reference numeral 4 denotes an external host computer. The host computer 4 is connected to a connecting unit 41 of the frequency synthesizer via a bus 40, for example, an $I^2C$ bus, and in this example, the connecting unit 41 corresponds to an input unit. Reference numeral 42 denotes an interface for normal communications with the host computer 4. For the interface 42, for example, an I2C interface or a RS232, which are standards of a serial interface, is employed. The interface 42 may also be a parallel interface.

Figure 2:
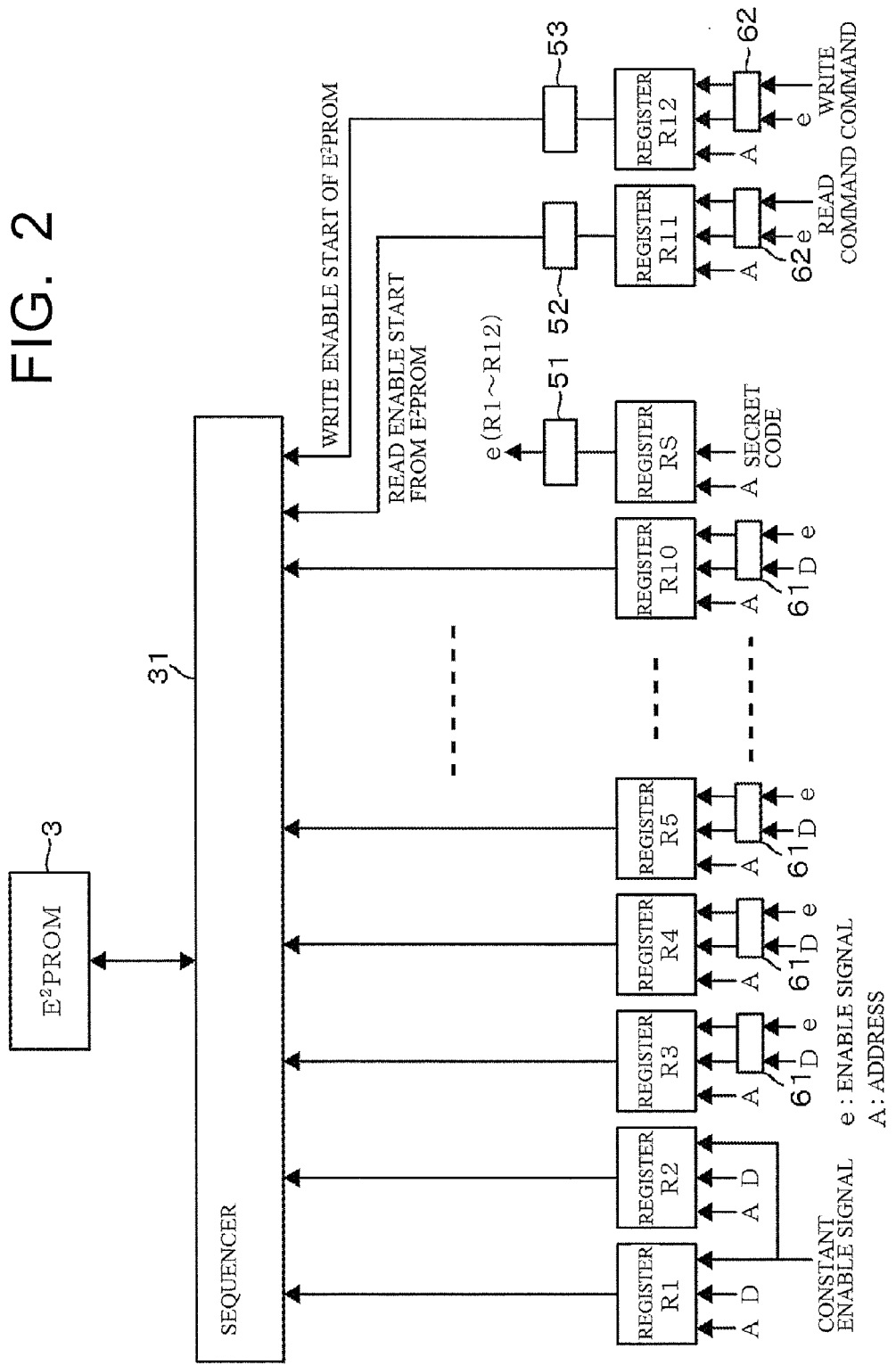
FIG. 2 is an explanatory view illustrating an operation according to an embodiment of the present disclosure.

$E^2PROM$ 3 stores the addresses of each of the registers 21 and data to be stored to the registers. The addresses correspond to the data. Data in the $E^2PROM$ 3 are read out by a sequencer 31 and written to the register 21 via the bus 20, for example, when the power source of the frequency synthesizer is turned ON. Data read out by the sequencer 31 is sent to the host computer 4 on condition that an Enable signal (described below) is input. Data is written to the $E^2PROM$ 3 via the sequencer 31. That is, data stored (held) in each register 21 or data sent from the host computer 4 via the interface 42 are written to the $E^2PROM$ 3 via the register 21 and the sequencer 31. The host computer 4 can write/read data to/from (accessible to) the $E^2PROM$ 3 on condition that a Read/Write enable signal (described below) is input. FIG. 2 is a schematic configuration diagram of a part of FIG. 1 for easy understanding of the operation. The following will be described with reference to FIG. 2 as well.

The register RS stores a secret code input from the host computer 4. In this example, the register RS corresponds to a volatile memory for the secret code. The register RS has a logic circuit unit 51 at the output side. Inputting the secret code allows the logic circuit unit 51 to output, for example, a logic "1", which is an Enable signal that enables access from the host computer 4 to the registers R3 to R12. The logic circuit unit 51 includes a digital comparator, and outputs the Enable signal when the code output from the register RS and the secret code configured in the logic circuit beforehand are the same. The registers R3 to R10 have a gate circuit unit 61 at the input side. The gate circuit unit 61 is configured being able to output the digital signal (parallel signal) to the output side only when the logic circuit unit 51 is outputting the Enable signal to the gate circuit 61. The registers R1 and R12 have a gate circuit unit 62 at input side. The gate circuit unit 62 is configured being able to output the digital signal to the output side only when the logic circuit unit 51 is outputting the Enable signal to the gate circuit 62. The gate circuits 61 and 62 are provided among the bus 20 and the registers R3 to R12 (omitted in FIG. 1). Each of the gate circuit unit 61 or 62 is specified by the address of the registers corresponding to R3 to R12, therefore, the gate circuit unit 61 (62) might be considered as the part of the registers R3 to R10 (R11, R12). Also gate circuits 61 (62) may be provided at address lines of the registers R3 to R10 (R11, R12) replacing with being provided at signal lines thereof. In this case, address signal is not inputted to the registers R3 to R10 (R11, R12) when enable signal is not inputted to the gate circuits 61 (62). Accordingly, the host computer 4 is accessible to the registers R3 to R12 on condition that the secret code is input to the register RS. Since the registers R1 and R2 have no access condition like the registers R3 to R12, the host computer 4 can freely access the registers R1 and R2. FIG. 2 shows a configuration as an example which has a same gate circuit (illustration omitted) as the gate circuit 61 at each input side of the registers R1 and R2 and Enable signal is always input into the each gate circuit from a circuit (illustration omitted). Also as other example, the gate circuits and Enable signal lines may not be provided.

The registers R11 and R12 store a Read command and a Write command, respectively. The register R11 has a logic circuit unit 52 at the output side. Inputting the Read command allows the logic circuit unit 52 to output, for example, a logic "1", which is a read Enable signal, to a read enable terminal of the sequencer 31. The read Enable signal is a signal that allows the host computer 4 to read out data from the E²PROM 3 via the register 21.

The register R12 has a logic circuit unit 53 at the output side. Inputting the Write command allows the logic circuit unit 53 to output, for example, a logic "1", which is a write Enable signal, to a write enable terminal of the sequencer 31. The write Enable signal is a signal that allows the host computer 4 to write data to the E²PROM 3 via the register 21. Accordingly, the host computer 4 can read data from the E²PROM 3 on condition that the Read command is input to the register R11 while the host computer 4 can write data to the E²PROM 3 on condition that the Write command is input to the register R12.

In this example, the register RS and the logic circuit unit 51 constitute a first enable output unit. And the register RS, the logic circuit unit 51, the gate circuit unit 62, the register R11 and the logic circuit unit 52 comprise a second enable output unit. The register R11 corresponds to a volatile memory for Read command. Moreover, the register RS, the logic circuit unit 51, the gate circuit unit 62 the register R12 and the logic circuit unit 53 comprise a third enable output unit. The register R12 corresponds to a volatile memory for Write command. In this example, the secret code indispensable to access to the register R3 to R10 (the first secret code), the secret code indispensable to output the Read Enable signal to the sequencer 31 (the second secret code) and the secret code indispensable to output Write Enable signal to the sequencer 31 (the third secret code), are commonalized. Therefore, the first enable output unit, the second enable output unit and the third enable output unit have the commonalized register RS as the volatile memory to input the same secret code.

Figure 3:
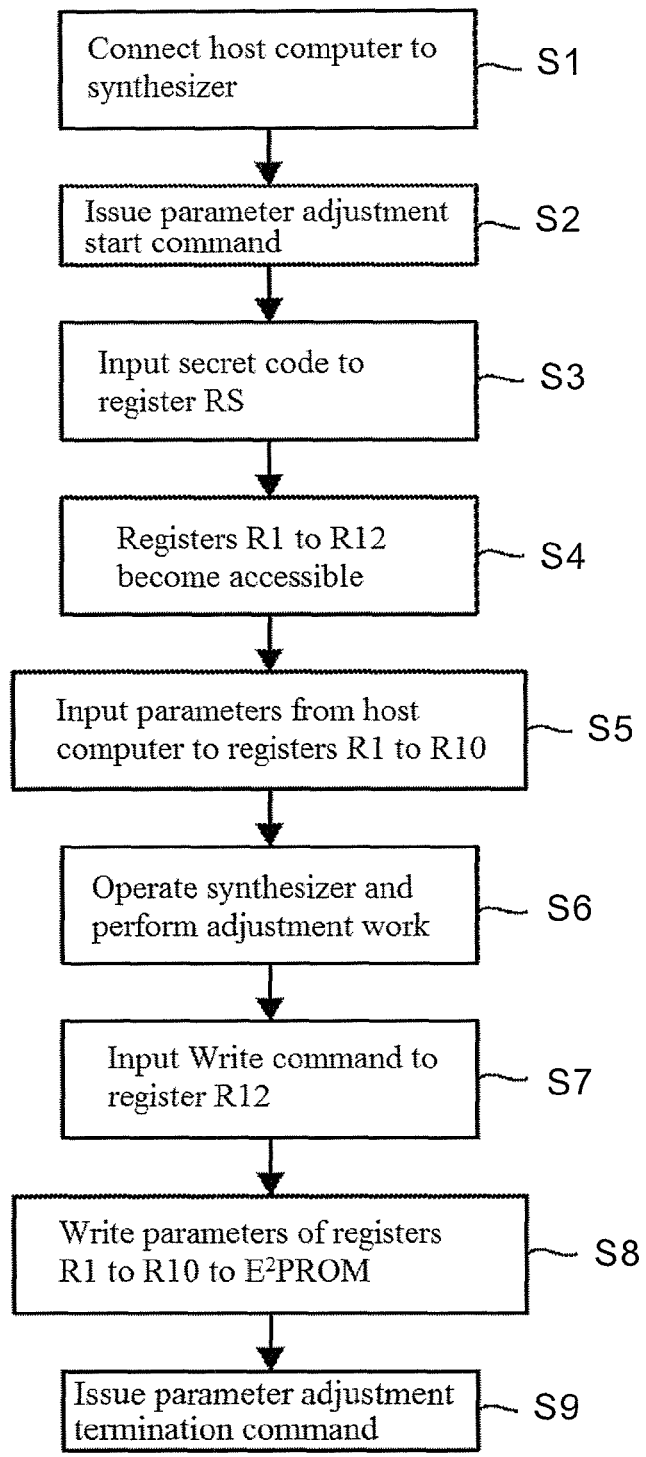
FIG. 3 is a flowchart describing the operation of the embodiment of the present disclosure.

Next, an operation of the above-described embodiment will be described. First, an example where the manufacturer inputs and adjusts the operation parameter to the frequency synthesizer is described with reference to FIG. 2 and FIG. 3. However, the specific process of debugging during development and the adjustment process will vary depending on the model or similar element; therefore, they should not be limited to the following example. First, the host computer 4 is connected to the connecting unit 41 of the frequency synthesizer via the bus 40 (step S1). Next, a parameter adjustment start command is issued on the screen of the host computer 4 (step S2). Further, the address and the secret code of the register RS are input (step S3). Accordingly, the secret code is output from the register RS to the logic circuit unit 51, the Enable signal is output from the logic circuit unit 51 to the specified registers, which are R3 to R12 (in detail, the gate circuits 61 and 62), and the registers R3 to R12 become accessible (step S4). Note that the registers R1 and R2 are freely accessible without inputting the secret code.

Next, the operation parameters are input from the host computer 4 to the registers R1 to R10 (step S5). The frequency synthesizer is operated and is checked for an operational state (step S6). According to the operating state, the value of the operation parameter is, for example, finely adjusted by the host computer 4. After confirming that a required operation is achieved, the Write command is input to the register R12 (step S7). Accordingly, the Write command is input from the register R12 to the logic circuit unit 53, and the Enable signal for writing is output from the logic circuit unit 53 to the sequencer 31. Consequently, the operation parameter group held in the registers R1 to R10 is batch-written to the E²PROM 3 (step S8). Afterwards, a parameter adjustment termination command is issued on the screen (step S9).

The manufacturer adjusts the operation parameter not only during production but also during maintenance upon request by the user or similar. In this case, for example, the secret code is also input to the register RS using the host computer 4 to make the registers R3 to R10 accessible in addition to the registers R1 and R2. The operation parameter subject to adjustment among the registers R1 to R10 is adjusted. Next, as described above, the Write command is input from the host computer 4 to the register R12 to write the operation parameters held in the registers R1 to R10 to the E²PROM 3. Further, data in the E²PROM 3 are read in the following cases. For example, after the operator at the manufacturer adjusts the operation parameters held in the registers R1 to R10 and checks for the operational states of the operation parameters, the operation parameters held in the registers R1 to R10 are reset to the values before the adjustment, or the operation parameters in the E²PROM 3 are checked, or similar case. This case also inputs the secret code to the register RS using an external computer and further inputs the Read command to the register R11.

An accessible state of the registers R3 to R10 and an accessible state from the host computer 4 to the E²PROM 3 are canceled by once turning off the power source of the frequency synthesizer. However, the accessible states may be automatically canceled (a process of disabling access) by issuing the parameter adjustment termination command on the screen of the host computer 4. Alternatively, the Enable signal may be removed by writing data other than the secret code from the host computer 4 to the register RS.

Figure 4:
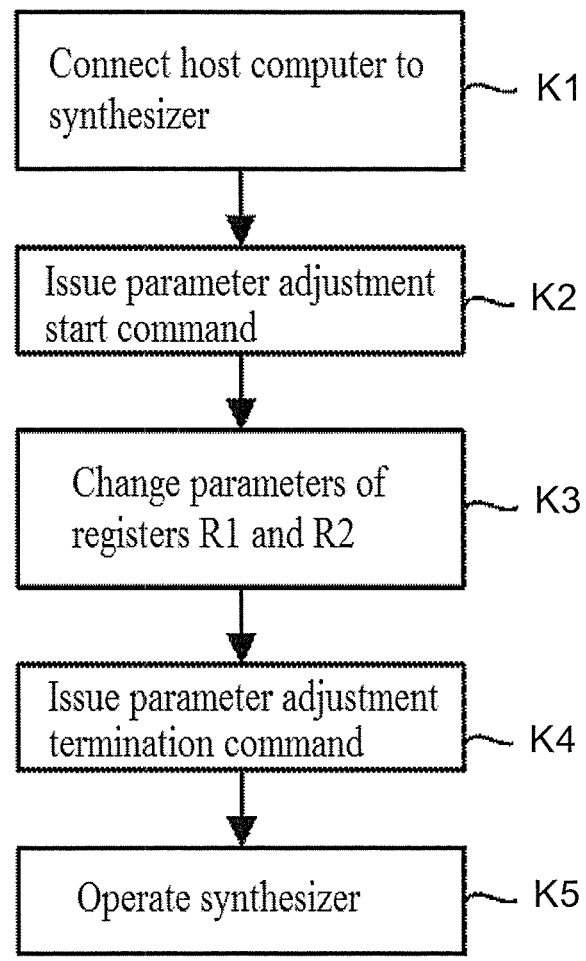
FIG. 4 is a flowchart describing the operation of the embodiment of the present disclosure.

The above-described work is performed by the operator who knows the secret code. However, even in the case where a user who does not know the secret code but changes the predetermined operation parameter, which are the operation parameters written to the registers R1 and R2 in this example, similar to those illustrated in FIG. 4, the host computer 4 is connected to the frequency synthesizer (step K1) and the operation is performed as follows. That is, the parameter adjustment start command is issued (step K2), subsequently the parameters of the registers R1 and R2 are changed (step K3), then the parameter adjustment termination command is issued (step K4). Next, the operation of the frequency synthesizer is resumed (step K5).

After the manufacturer adjusts the operation parameters, if the power source of the frequency synthesizer has been turned off once or the parameter adjustment termination command has been issued, the host computer 4 is inaccessible to the registers R3 to R10 and the E²PROM 3. Moreover, the address and the secret code of the register RS are not notified to the user. In view of this, since the user is not notified about the Read command and the Write command as well, the operation parameters stored in the specified registers R3 to R10 and data in the E²PROM 3 are not unnecessarily rewritten by the user.

In the above-described embodiment, some registers (specified registers) are configured to be accessible by inputting the secret code from the host computer 4. Additionally, inputting the Read command or the Write command from the host computer 4 allows reading or writing of the E²PROM 3 via the sequencer 31. Accordingly, for example, an operator who is qualified to change the operation parameter group, such as an operator at the manufacturer, can change the operation parameter and access the non-volatile memory. On the other hand, unnecessary rewriting of some operation parameters among the operation parameter group and the operation parameter stored in the non-volatile memory due to access by an operator who is considered to possibly be interfering by changing the operation parameter group, such as a user, can be prevented. Thus, if the secret code and the address of the register RS where the secret code is to be inputted are unknown, access similar to that of the manufacturer cannot be made. Consequently, unnecessary rewriting due to access can be prevented with high certainty. Also the controller 2 may be constructed so that operation parameters to be stored in the registers R1 and R2 is not read from E$^2$PROM 3, and is not written into E$^2$PROM 3. In descriptions above, the first, second and third secret codes are commonalized, however, they may be different each other.

In this case, three respective volatile memories to input the first to third secret code such as the first to third registers, are used. In detail, devices are added to a configuration shown in FIG. 2 as follows. Registers RS1 and RS2 (not shown in Fig) are configured other than the register RS. Each of the registers RS1 and RS2 has corresponding logic circuit unit respectively. One of the logic circuit unit inputs the enable signal to the gate circuit unit 61 connected to the input side of R11, by inputting the second secret code to RS1. Moreover, the other logic circuit unit inputs the enable signal to the gate circuit unit 61 connected to the input side of R12, by inputting the third secret code to RS2.

While in the above-described embodiment, the secret code for accessing the registers R1 to R10 where the operation parameters are stored, and the secret code that is a condition for generating the Read/Write enable signals, which allow the sequencer 31 to read/write data, are common, they may differ from one another. In this case, the Read/Write enable signals may be output by inputting a secret code dedicated to the registers R11 and R12. The electronic equipment according to the present disclosure should not be limited to a frequency synthesizer. The electronic equipment may be another communication device, an exposure apparatus employed for manufacturing a semiconductor device, or similar.

What is claimed is:

1. An electronic equipment, comprising:
    a writable non-volatile memory for storing an operation parameter group to operate the electronic equipment;
    an input unit to which a setting signal to set the operation parameter is to be inputted;
    a plurality of first volatile memories for storing respective plurality of the operation parameters with a different address from one another;
    a plurality of second volatile memories for storing respective plurality of the operation parameters with a different address from one another, respective plurality of the operation parameters in the second volatile memories being different from respective plurality of the operation parameters in the first volatile memories;
    a first enable output unit for outputting an Enable signal which enables the input unit to write the operation parameter to the second volatile memory by inputting a first secret code from the input unit;
    a sequencer for reading and writing the non-volatile memory;
    a second enable output unit for outputting an Read Enable signal to the sequencer by inputting a Read command and a second secret code from the input unit, the Enable signal allowing an operation parameter stored in the non-volatile memory to be read out to at least the second volatile memory; and
    a third enable output unit for outputting an Write Enable signal to the sequencer by inputting a Write command and a third secret code from the input unit, the Enable signal allowing an operation parameter stored in at least the second volatile memory to be written to the non-volatile memory.

2. The electronic equipment according to claim 1, wherein the first enable output unit includes:
    a volatile memory assigned addresses for a secret code; and
    a circuit unit outputs a first Enable signal when the first secret code is inputted to the volatile memory for the secret code.

3. The electronic equipment according to claim 1, wherein the second enable output unit includes:
    a volatile memory assigned addresses for a secret code, and
    a volatile memory assigned addresses for the Read command,
    the second enable output unit outputting the Read Enable Signal when the second secret code is inputted to the volatile memory for the secret code and the Read command is inputted to the volatile memory for the Read command.

4. The electronic equipment according to claim 1, wherein the third enable output unit includes:
    a volatile memory assigned addresses for a secret code, and
    a volatile memory assigned addresses for the Write command,
    the third enable output unit outputting the Write Enable Signal when the third secret code is inputted to the volatile memory for the secret code and the Write command is inputted to the volatile memory for the Write command.

5. The electronic equipment according to claim 1, wherein the first, second and third secret codes are commonalized.

6. The electronic equipment according to claim 1, wherein the volatile memories for the inputs of secret codes in the first, second and third enable output unit are communalized; and
    the first, second and third secret codes are commonalized.

7. The electronic equipment according to claim 1, wherein the respective parameters stored in plural of the first volatile memories include the parameter either of an On-state which generates an alarm in abnormal state or an Off-state which generates no alarm in abnormal state.

8. The electronic equipment according to claim 1, wherein the electronic equipment is an oscillator.

9. The electronic equipment according to claim 1, wherein the input unit is a connection unit which is connected to an external computer.

* * * * *